US007897455B2

(12) United States Patent
Ozawa et al.

(10) Patent No.: US 7,897,455 B2
(45) Date of Patent: Mar. 1, 2011

(54) SEMICONDUCTOR DEVICE AND METHOD OF MANUFACTURING THE SAME (75) Inventors: Yoshio Ozawa, Yokohama (JP); Isao Kamioka, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 659 days.

(21) Appl. No.: 11/525,118

(22) Filed: Sep. 22, 2006

(65) Prior Publication Data
US 2007/0173020 A1 Jul. 26, 2007

(30) Foreign Application Priority Data
Jan. 20, 2006 (JP) ............................. 2006-012649

(51) Int. Cl.
*H01L 29/788* (2006.01)
(52) U.S. Cl. .................... 438/257; 438/201; 438/266; 257/314; 257/315; 257/316; 257/321; 257/324; 257/257; 257/E29.305; 257/325; 257/E29.306; 257/E27.078; 257/E21.179; 257/E29.3; 257/E21.209; 257/E29.304
(58) Field of Classification Search .................. 257/288, 257/314–316, 632, 635–640, 321, 324, 325, 257/E27.078, E29.3, E29.304, E29.305, E29.306, 257/E21.179, E21.209; 438/211, 257, 262–266, 438/584, 585, 592–594, 635, 758, 765, 769, 438/770, 775, 778, 787, 791, 201
See application file for complete search history.

(56) References Cited
U.S. PATENT DOCUMENTS
6,306,758 B1 * 10/2001 Park ............................ 438/636
6,784,484 B2    8/2004 Blomme et al.

(Continued)

FOREIGN PATENT DOCUMENTS
JP    10-65028    3/1998

(Continued)

OTHER PUBLICATIONS
Mitani, Y. et al., "Nonvolatile Semiconductor Memory Device, Semiconductor Device and Manufacturing Method of Nonvolatile Semiconductor Memory Device," U.S. Appl. No. 11/491,054, filed Jul. 24, 2006.

(Continued)

*Primary Examiner*—A. Sefer
*Assistant Examiner*—Farid Khan
(74) *Attorney, Agent, or Firm*—Finnegan, Henderson, Farabow, Garrett & Dunner, L.L.P.

(57) ABSTRACT

A semiconductor device manufacturing method includes forming a first insulating film on a semiconductor substrate containing silicon, the first insulating film having a first dielectric constant and constituting a part of a tunnel insulating film, forming a floating gate electrode film on the first insulating film, the floating gate electrode film being formed of a semiconductor film containing silicon, patterning the floating gate electrode film, the first insulating film, and the semiconductor substrate to form a first structure having a first side surface, exposing the first structure to an atmosphere containing an oxidizing agent, oxidizing that part of the floating gate electrode film which corresponds to a boundary between the first insulating film and the floating gate electrode film using the oxidizing agent, to form a second insulating film having a second dielectric constant smaller than the first dielectric constant and constituting a part of the tunnel insulating film.

16 Claims, 5 Drawing Sheets

U.S. PATENT DOCUMENTS

| | | | |
|---|---|---|---|
| 6,833,582 B2 * | 12/2004 | Mine et al. | 257/326 |
| 6,952,032 B2 * | 10/2005 | Forbes et al. | 257/314 |
| 7,081,386 B2 | 7/2006 | Ozawa et al. | |
| 2002/0190311 A1 * | 12/2002 | Blomme et al. | 257/321 |
| 2004/0084711 A1 * | 5/2004 | He et al. | 257/314 |
| 2004/0256660 A1 * | 12/2004 | Ozawa et al. | 257/316 |
| 2005/0224863 A1 * | 10/2005 | Hieda et al. | 257/315 |

FOREIGN PATENT DOCUMENTS

| | | |
|---|---|---|
| JP | 10-335500 | 12/1998 |
| JP | 2002-110828 | 4/2002 |
| JP | 2004-356203 | 12/2004 |
| JP | 2005-197624 | 7/2005 |
| JP | 2005-235987 | 9/2005 |
| JP | 2006-13003 | 1/2006 |

OTHER PUBLICATIONS

Notice of Reasons for Rejection, mailed Nov. 2, 2010, in corresponding Japanese Application No.: 2006-012649, and English-language translation thereof.

* cited by examiner

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2006-012649, field Jan. 20, 2006, the entire contents of which are incorporated herein by reference.

BACKGROUND OF THE INVENTION

1. Field of the Invention

The present invention relates to a semiconductor device and a method of manufacturing the semiconductor device.

2. Description of the Related Art

Electrically erasable nonvolatile semiconductor memory devices need to have a high-speed writing and erasing characteristic and an excellent charge retention characteristic.

U.S. Pat. No. 6,784,484 proposes a tunnel insulating film having a structure in which a high dielectric constant film is sandwiched between low dielectric constant films. This structure makes it possible to achieve the high-speed writing and erasing characteristic and the excellent charge retention characteristic.

However, this proposal discloses a method of forming a high dielectric constant film but not a method of forming a low dielectric constant film. A method of forming a tunnel insulating film is an important factor for obtaining a high-performance tunnel insulating film excellent in film quality and interface characteristic. Accordingly, the above proposal cannot provide a tunnel insulating film excellent in film quality and interface characteristic. This results in difficulty in obtaining a high-performance nonvolatile memory.

With a continuous reduction in the size of elements in the nonvolatile memory, the parasitic capacitance between adjacent floating gates becomes a major problem. The parasitic capacitance between the floating gates disadvantageously increases an operating voltage and induces frequent malfunctioning. The structure disclosed in the above proposal cannot reduce the parasitic capacitance between the floating gates. This results in difficulty in obtaining a high-performance nonvolatile memory.

The structure in which a high dielectric constant film is sandwiched between low dielectric constant films has thus been proposed to achieve the high-speed writing and erasing characteristic and the excellent charge retention characteristic. However, the proposed structure cannot provide a tunnel insulating film excellent in film quality and interface characteristic. This results in difficulty in obtaining a high-performance nonvolatile memory. The proposed structure also fails to reduce the parasitic capacitance between the floating gates. This also results in difficulty in obtaining a high-performance nonvolatile memory.

BRIEF SUMMARY OF THE INVENTION

A method of manufacturing a semiconductor device in accordance with a first aspect of the present invention comprises forming a first insulating film on a semiconductor substrate containing silicon, the first insulating film having a first dielectric constant and constituting a part of a tunnel insulating film; forming a floating gate electrode film on the first insulating film, the floating gate electrode film being formed of a semiconductor film containing silicon; patterning the floating gate electrode film, the first insulating film, and the semiconductor substrate to form a first structure having a first side surface; exposing the first structure to an atmosphere containing an oxidizing agent; oxidizing that part of the floating gate electrode film which corresponds to a boundary between the first insulating film and the floating gate electrode film using the oxidizing agent, to form a second insulating film having a second dielectric constant smaller than the first dielectric constant and constituting a part of the tunnel insulating film; forming an inter electrode insulating film on the first structure; forming a control gate electrode film on the inter electrode insulating film; and patterning the control gate electrode film, the inter electrode insulating film, and the floating gate electrode film to form a second structure having a second side surface perpendicular to the first side surface.

A method of manufacturing a semiconductor device in accordance with a second aspect of the present invention comprises forming a first insulating film on a semiconductor substrate containing silicon, the first insulating film having a first dielectric constant and constituting a part of a tunnel insulating film; forming a floating gate electrode film on the first insulating film, the floating gate electrode film being formed of a semiconductor film containing silicon; patterning the floating gate electrode film, the first insulating film, and the semiconductor substrate to form a first structure having a first side surface; forming an inter electrode insulating file on the first structure; forming a control gate electrode film on the inter electrode insulating film; patterning the control gate electrode film, the inter electrode insulating film, the floating gate electrode film to form a second structure having a second side surface perpendicular to the first side surface; exposing the second structure to an atmosphere containing an oxidizing agent; and oxidizing that part of the floating gate electrode film which corresponds to a boundary between the first insulating film and the floating gate electrode film using the oxidizing agent, to form a second insulating film having a second dielectric constant smaller than the first dielectric constant and constituting a part of the tunnel insulating film.

A semiconductor device in accordance with a third aspect of the present invention comprises a semiconductor substrate containing silicon; a tunnel insulating film formed on the semiconductor substrate and including a first insulating film having a first dielectric constant and a second insulating film formed on the first insulating film and having a second dielectric constant smaller than the first dielectric constant; a floating gate electrode formed on the tunnel insulating film and formed of a semiconductor film containing silicon; an inter electrode insulating film formed on the floating gate electrode; and a control gate electrode formed on the inter electrode insulating film, wherein the second insulating film is formed of an oxide film and is thicker at its ends than in its center in a predetermined direction.

DETAILED DESCRIPTION OF THE INVENTION

Embodiments of the present invention will be described below with reference to the drawings.

Embodiment 1

A semiconductor device in accordance with a first embodiment of the present invention will be described below taking the case of a NAND type flash memory that is an electrically erasable nonvolatile semiconductor memory device.

Figure 1:
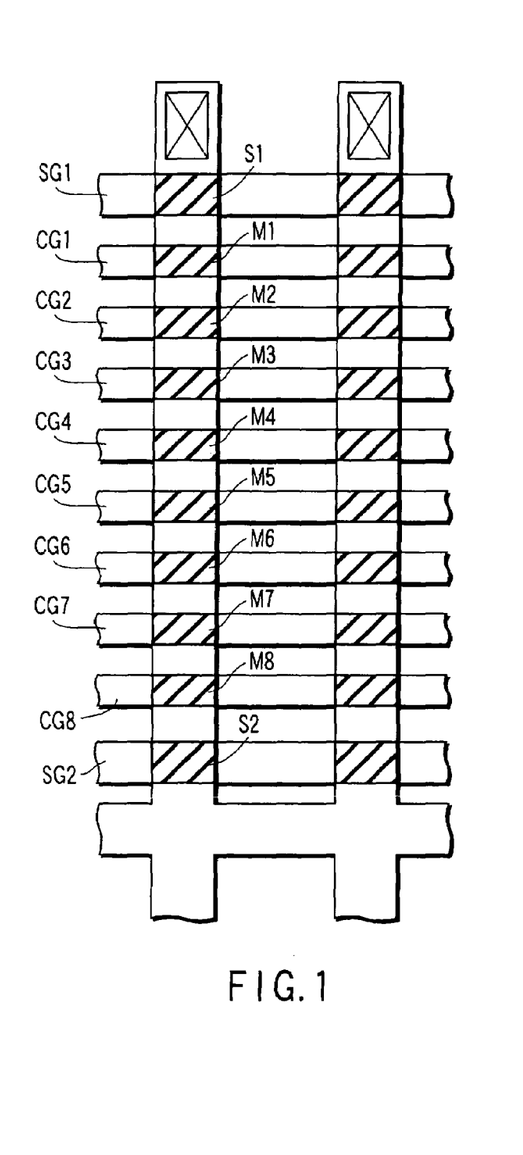
FIG. 1 is a plan view schematically showing the configuration of a semiconductor device in accordance with a first and second embodiments of the present invention.
Figure 2:
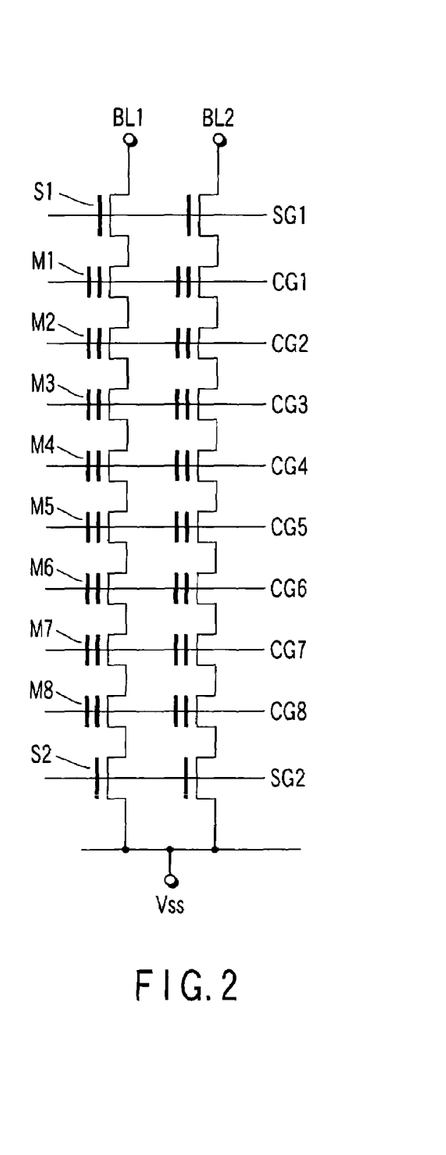
FIG. 2 is a diagram showing an equivalent circuit of the semiconductor device in accordance with the first and second embodiments of the present invention.

FIG. 1 is a plan view schematically showing the configuration of the NAND type flash memory in accordance with the present embodiment (bit lines are not shown). FIG. 2 is an equivalent circuit diagram of the configuration shown in FIG. 1.

As shown in FIGS. 1 and 2, each NAND cell unit has memory cells M1 to M8 connected in series between select transistors S1 and S2. Select gate lines SG1 and SG2 are connected to the select transistors S1 and S2. Control gate lines (word lines) CG1 to CG8 are connected to the memory cells M1 to M8. A bit line BL1 or BL2 is connected to each select transistor S1. The eight memory cells are shown in the figure. However, the number of memory cells is not limited to eight.

With reference to FIGS. 3A and 3B to 7A and 7B, description will be given of a method of manufacturing a semiconductor device in accordance with the present embodiment. FIGS. 3A to 7A are sectional views of the semiconductor device in a bit line direction. FIGS. 3B to 7B are sectional views of the semiconductor device in a word line direction.

Figure 3A:
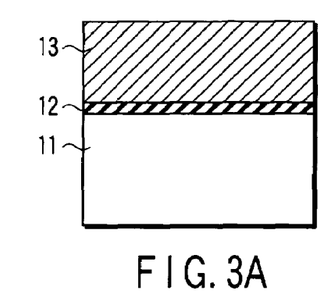
FIGS. 3A and 3B are sectional views schematically showing part of a method of manufacturing a semiconductor device in accordance with the first embodiment of the present invention.
Figure 3B:
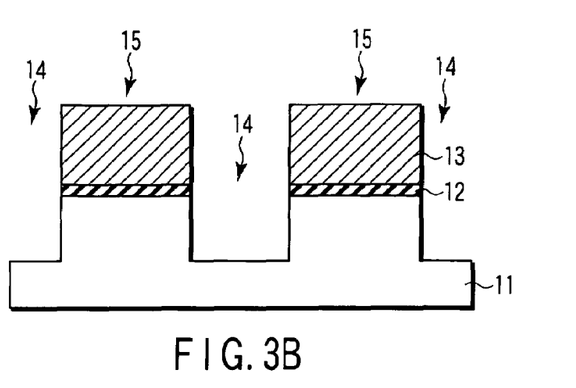

First, as shown in FIGS. 3A and 3B, a silicon nitride film (first insulating film) 12 is formed on a silicon substrate (semiconductor substrate) 11 doped with impurities; the silicon nitride film 12 constitutes a part of a tunnel insulating film and has a thickness of 7 nm. Specifically, the silicon nitride film 12 is formed by nitriding a surface of the silicon substrate 11 by a plasma nitriding method. The plasma nitriding method uses a nitrogen radical as a nitriding agent. This results in the formation of a silicon nitride film 12 excellent in film quality and insulation properties, thus enabling the improvement of a charge retention characteristic. A semiconductor film containing silicon is subsequently formed on the silicon nitride film 12 as a floating gate electrode film 13. Specifically, a phosphorous-doped polysilicon film 13 of thickness 100 nm is formed by a CVD (Chemical Vapor Deposition) method.

Then, a mask pattern (not shown) extending in the bit line direction is formed on the polysilicon film 13. The mask pattern is used as a mask to pattern the polysilicon film 13, silicon nitride film 12, and silicon substrate 11 by an RIE (Reactive Ion Etching) method. This results in an extending structure (first structure) 15 sandwiched between isolation trenches 14 and extending in the bit line direction. The isolation trench has a width of about 50 nm and a depth of about 100 nm.

Figure 4A:
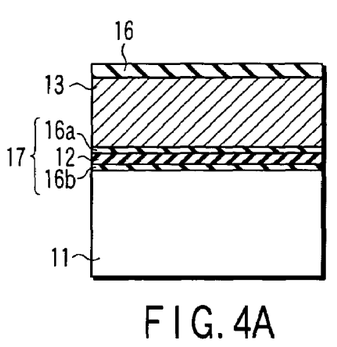
FIGS. 4A and 4B are sectional views schematically showing part of a method of manufacturing a semiconductor device in accordance with the first embodiment of the present invention.
Figure 4B:
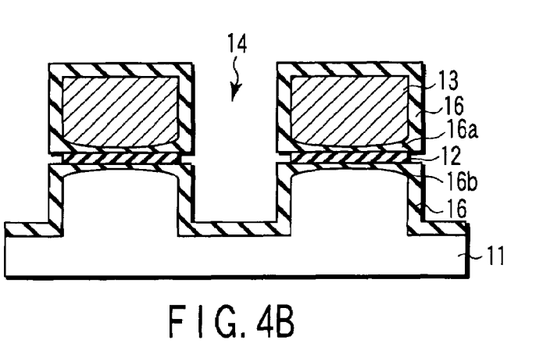

Then, as shown in FIGS. 4A and 4B, the substrate on which the extending structure 15 is formed is exposed to a gas atmosphere containing an oxidizing agent. Nitrogen monoxide (NO) is used as the oxidizing agent, and temperature of the substrate is set at 900° C. This causes the exposed surfaces of the silicon substrate 11 and polysilicon film 13 to be oxidized. The oxidizing agent contains nitrogen, both oxidization and nitriding occur. This results in the formation of a silicon oxide film 16 on the exposed surfaces of the silicon substrate 11 and polysilicon film 13, the silicon oxide film 16 containing nitrogen and having a thickness of about 10 nm. The silicon oxide film containing nitrogen is hereinafter referred to as a silicon oxinitride film. An oxide film containing nitrogen is hereinafter referred to as an oxinitride film. Oxidization involving nitriding is hereinafter referred to as oxinitriding. The silicon oxinitride film 16 has a concentration distribution across the thickness. The concentration of nitrogen is higher near the interface between the silicon oxinitride film 16 and the silicon substrate 11 and near the interface between the silicon oxinitride film 16 and polysilicon film 13.

In the present process, the oxidizing agent diffuses through the polysilicon film 13 and reaches the interface between the silicon nitride film 12 and the polysilicon film 13. This results in the oxidization and nitriding (oxinitriding) of the polysilicon film 13 near the interface. A silicon oxide film (silicon oxinitride film, second insulating film) 16a is thus formed which contains nitrogen and which constitutes a part of the tunnel insulating film. Similarly, the oxidizing agent diffuses through the silicon substrate 11 and reaches the interface between the silicon nitride film 12 and the silicon substrate 11. This results in the oxidization and nitriding (oxinitriding) of the silicon substrate 11 near the interface. A silicon oxide film (silicon oxinitride film, third insulating film) 16b is thus formed which contains nitrogen and which constitutes a part of the tunnel insulating film.

Explanation will be given below of the reason why the silicon oxinitride film 16a is formed at the interface between the silicon nitride film 12 and the polysilicon film 13, whereas the silicon oxinitride film 16b is formed at the interface between the silicon nitride film 12 and the silicon substrate 11. The oxidizing agent such as nitrogen monoxide diffuses easily through the polysilicon film 13 and the silicon substrate 11 and can thus easily reach the interface of the silicon nitride film 12. On the other hand, the silicon nitride film 12 has a high diffusion barrier property. Accordingly, the oxidizing agent having reached the interface of the silicon nitride film 12 cannot pass easily through the silicon nitride film 12. Further, an oxidizing reaction or an oxinitriding reaction preferentially occurs on an end surface of a silicon crystal such as the interface between the silicon nitride film 12 and the polysilicon film 13 or the interface between the silicon nitride film 12 and the silicon substrate 11. This results in the formation of a silicon oxinitride film 16a at the interface between the silicon nitride film 12 and the polysilicon film 13 and a silicon oxinitride film 16b at the interface between the silicon nitride film 12 and the silicon substrate 11.

As shown in FIG. 4B, the silicon oxinitride films 16a and 16b formed by the diffusion of the oxidizing agent as described above are thicker at their ends than in their center in a direction perpendicular to the bit lines (direction perpendicular to side surfaces of the extending structure 15). More specifically, the film thickness gradually increases from the center toward the ends. For example, the thickness of the silicon oxinitride films 16a and 16b is about 0.2 nm in their center and about 5 nm at their ends. The silicon oxinitride films 16a and 16b have a relative dielectric constant of about 4 to 5, which is smaller than that of the silicon nitride film 12. The silicon oxinitride films 16a and 16b have an average nitrogen concentration of at most 20 atomic %.

A tunnel insulating film 17 formed of the silicon nitride film 12 and silicon oxinitride films 16a and 16b is obtained as described above. The tunnel insulating film 17 has a structure in which the high dielectric constant film (silicon nitride film 12) is sandwiched between the low dielectric constant films (silicon oxinitride films 16a and 16b). The tunnel insulating film 17 has a high-speed writing and erasing characteristic and an excellent charge retention characteristic.

Figure 5A:
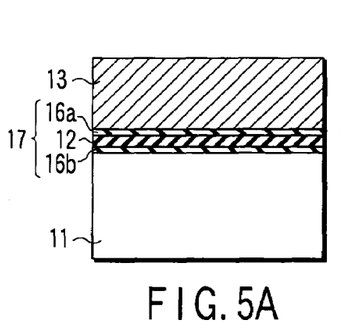
FIGS. 5A and 5B are sectional views schematically showing part of a method of manufacturing a semiconductor device in accordance with the first embodiment of the present invention.
Figure 5B:
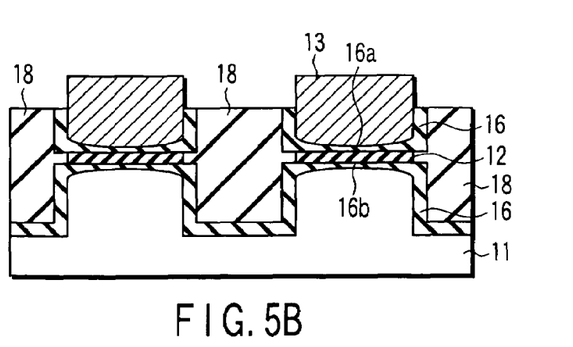

Then, as shown in FIGS. 5A and 5B, a silicon oxide film is deposited all over the surface of the resulting structure as an isolation insulating film 18. The isolation insulating film 18 is subsequently flattened by a CMP (Chemical Mechanical Polishing) method. The isolation insulating film 18 is partly etched away with a solution of diluted hydrofluoric acid. This leads to polysilicon film 13. The exposed side surface is, for example, about 50 nm in height.

Figure 6A:
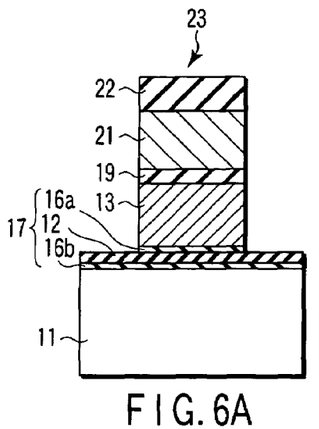
FIGS. 6A and 6B are sectional views schematically showing part of a method of manufacturing a semiconductor device in accordance with the first embodiment of the present invention.
Figure 6B:
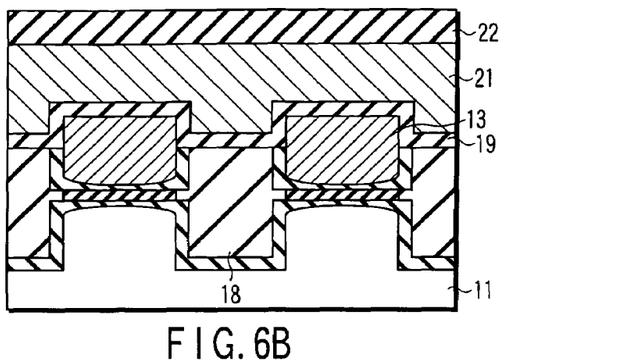

Then, as shown in FIGS. 6A and 6B, an ONO (Oxide/Nitride/Oxide) film of thickness 15 nm is formed as a inter electrode insulating film 19 covering the surfaces of the polysilicon film 13 and isolation insulating film 18. The ONO film 19 has a three-layer structure in which a silicon nitride film is sandwiched between silicon oxide films. Each of the three layers has a thickness of 5 nm. A control gate electrode film 21 of thickness 100 nm is subsequently formed on the inter electrode insulating film 19 by the CVD method. The control gate electrode film 21 has a two-layer structure composed of a polysilicon film and a tungsten silicide film. A silicon nitride film is further formed on the control gate electrode film 21 as an RIE mask film 22.

A resist pattern (not shown) extending in a word line direction is then formed on the silicon nitride film 22. The resist pattern is used as a mask to pattern the silicon nitride film 22, control gate electrode film 21, ONO film (inter electrode insulating film) 19, polysilicon film (floating gate electrode film) 13, and silicon oxinitride film 16a by the RIE method. This results in a gate structure 23 having side surfaces parallel to the word line direction. That is, the floating gate electrode 13 and control gate electrode (word line) 21 are formed.

Figure 7A:
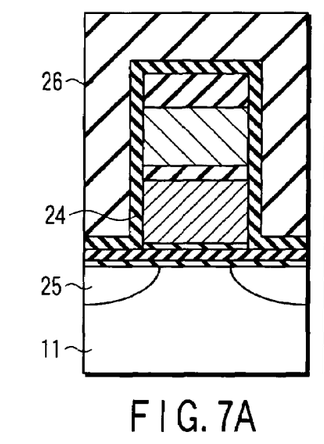
FIGS. 7A and 7B are sectional views schematically showing part of a method of manufacturing a semiconductor device in accordance with the first embodiment of the present invention.
Figure 7B:
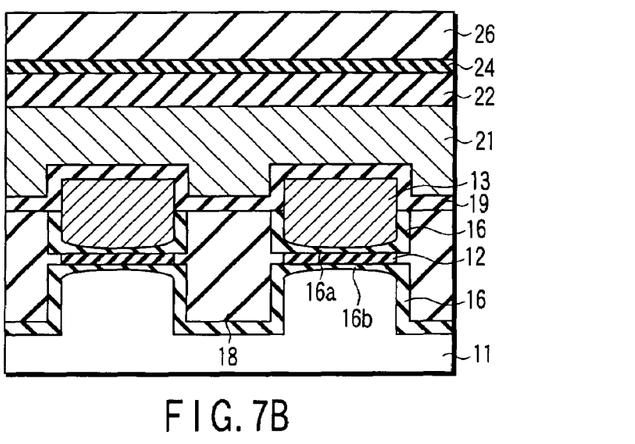

Then, as shown in FIGS. 7A and 7B, a silicon oxide film is formed on the surface of the gate structure 23 as a gate sidewall insulating film 24. The gate sidewall insulating film 24 is formed by a combination of a thermal oxidation method and the CVD method. Impurities are then ion-implanted in the silicon substrate 11 to form a source/drain diffusion layer 25. This results in the formation of a memory cell. An interlayer insulating film 26 is formed all over the surface of the resulting structure. During the subsequent steps, although not shown, wires and the like are formed to complete a nonvolatile memory.

Now, description will be given of memory cell operations of the nonvolatile memory in accordance with the present embodiment.

FIGS. 8 to 11 are energy band diagrams illustrating the memory cell operations. As described above, the tunnel insulating film 17 has the structure in which the high dielectric constant film (silicon nitride film 12) is sandwiched between the low dielectric constant films (silicon oxinitride films 16a and 16b). $E_F$ denotes a Fermi level and $e^-$ denotes an electron.

Figure 8:
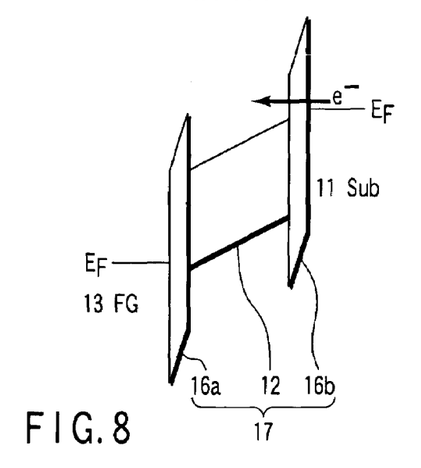
FIG. 8 is an energy band diagram illustrating a memory cell operation in accordance with the first and second embodiments.

FIG. 8 is an energy band diagram showing the condition of a memory cell during data writing. During data writing, a high positive voltage is applied to the control gate 21 (see FIGS. 7A and 7B). The tunnel insulating film 17 is subjected to a voltage corresponding to the capacitance ratio (coupling ratio) of the tunnel insulating film 17 to the inter electrode insulating film 19. The low dielectric constant films 16a and 16b have a smaller dielectric constant than the high dielectric constant film 12. A relatively larger electric field is thus applied to the low dielectric constant films 16a and 16b. This leads to an energy band condition such as the one shown in FIG. 8. As a result, electrons pass through the tunnel insulating film 17 without being blocked by the potential barrier of the high dielectric constant film 12. When the low dielectric constant film 16b is provided at the interface between the silicon substrate 11 and the high dielectric constant film 12, tunnel distance is reduced to enable a larger tunnel current to flow. The floating gate 13 can thus be charged in a shorter time. This makes it possible to reduce the time required for writing, that is, the time required to supply a predetermined amount of electrons. Consequently, a high-speed writing operation can be performed. In other words, a writing voltage can be reduced which is required to supply a predetermined amount of electrons in a predetermined time.

Figure 9:
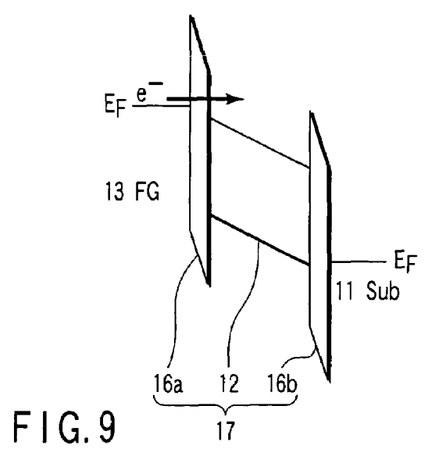
FIG. 9 is an energy band diagram illustrating a memory cell operation in accordance with the first and second embodiments.

FIG. 9 is an energy band diagram showing the condition of a memory cell during data erasing. During data erasing, a high negative voltage is applied to the control gate 21 (see FIGS. 7A and 7B). The tunnel insulating film 17 is subjected to a voltage corresponding to the capacitance ratio (coupling ratio) of the tunnel insulating film 17 to the inter electrode insulating film 19. The low dielectric constant films 16a and 16b have a smaller dielectric constant than the high dielectric constant film 12. A relatively larger electric field is thus applied to the low dielectric constant films 16a and 16b. This leads to an energy band condition such as the one shown in FIG. 9. As a result, electrons pass through the tunnel insulating film 17 without being blocked by the potential barrier of the high dielectric constant film 12. When the low dielectric constant film 16a is provided at the interface between the floating gate 13 and the high dielectric constant film 12, tunnel distance is reduced to enable a larger tunnel current to flow. The floating gate 13 can thus be discharged in a shorter time. This makes it possible to reduce the time required for erasing, that is, the time required to remove a predetermined amount of electrons from the floating gate 13. Consequently, a high-speed erasing operation can be performed. In other words, an erasing voltage can be reduced which is required to remove a predetermined amount of electrons from the floating gate 13 in a predetermined time.

Figure 10:
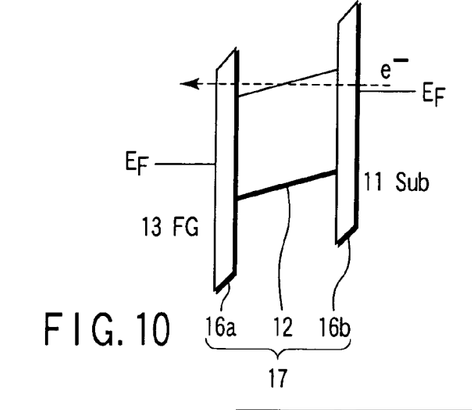
FIG. 10 is an energy band diagram illustrating a memory cell operation in accordance with the first and second embodiments.

FIG. 10 is an energy band diagram showing the condition of a memory cell during data reading. During data reading, a low positive voltage is applied to the control gate 21 (see FIGS. 7A and 7B). The tunnel insulating film 17 is subjected to a voltage corresponding to the capacitance ratio (coupling ratio) of the tunnel insulating film 17 to the inter electrode insulating film 19. A low voltage is applied to the tunnel insulating film 17, resulting in an energy band condition such as the one shown in FIG. 10. Electrons are thus blocked by the potential barrier of the high dielectric constant film 12, with almost no tunnel current flowing. Therefore, during data reading, variations in charges accumulated in the floating gate 13 can be sufficiently suppressed to provide the excellent charge retention characteristic.

Figure 11:
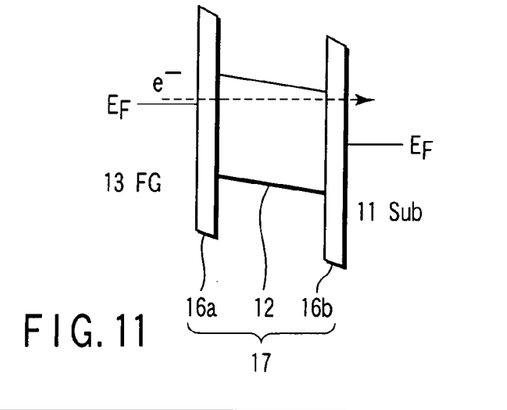
FIG. 11 is an energy band diagram illustrating a memory cell operation in accordance with the first and second embodiments.

FIG. 11 is an energy band diagram showing a steady state in which none of the writing, erasing, and reading operations are performed. Here, by way of example, a memory cell after writing is shown. In the steady state, charges accumulated in the floating gate 13 causes a weak electric field to be applied to the tunnel insulating film 17, resulting in an energy band condition such as the one shown in FIG. 11. Electrons are thus blocked by the potential barrier of the high dielectric constant film 12, with almost no tunnel current flowing. Therefore, in the steady state, variations in charges accumulated in the inter electrode insulating film 19 can be sufficiently suppressed to provide the excellent charge retention characteristic.

As described above, in the nonvolatile memory in accordance with the present embodiment, the tunnel insulating film 17 has the structure in which the high dielectric constant film 12 is sandwiched between the low dielectric constant films 16a and 16b. This structure increases the speeds of the writing and erasing operations and provides the excellent charge retention characteristic. This effect is suitably markedly produced by the present embodiment, which performs a writing and erasing operations on the basis of the tunnel injection scheme. A hot carrier injection scheme also serves to increase the speeds of the writing and erasing operations to some degree.

The present embodiment also produces such an excellent effect as described below using the manufacture method shown in FIGS. 3A and 3B to 7A and 7B.

In the present embodiment, the silicon oxinitride films (silicon oxide films containing nitrogen) 16a and 16b are formed by oxidizing and nitriding (oxinitriding) the polysilicon film 13 and the silicon substrate 11. The silicon oxinitride films 16a and 16b are thus more excellent than those formed by a deposition method. The present embodiment therefore enables a reliable, high-performance nonvolatile memory to be obtained using a tunnel insulating film excellent in film quality and interface characteristics.

In the present embodiment, the silicon nitride film 12 is formed by nitriding the silicon substrate 11 with a nitrogen radical. This results in silicon nitride films more excellent in film quality and insulation properties than those formed by the deposition method. Therefore, also in this view, the present embodiment enables an excellent tunnel insulating film to be formed, thus providing a reliable, high-performance nonvolatile memory.

In the present embodiment, the oxidizing agent is nitrogen monoxide (NO), so that the polysilicon film 13 and the silicon substrate 11 are oxinitrided. The silicon oxinitride film 16 formed by oxinitriding has a concentration distribution across the thickness. The nitrogen concentration is thus higher near the interface between the silicon oxinitride film 16 and the silicon substrate 11 and near the interface between the silicon oxinitride film 16 and the polysilicon film 13. Consequently, the diffusion barrier action of the higher-nitrogen-concentration layer near the interface suppresses the diffusion of oxygen and thus an increase in the thickness of the silicon oxinitride film 16. That is, the silicon oxinitride film 16 is prevented from being thicker than required even with the formation of silicon oxinitride films 16a and 16b of a sufficient thickness. This prevents a decrease in the channel width of the memory cell which may be caused by an increase in the thickness of the silicon oxinitride film 16. A nonvolatile memory with excellent characteristics can thus be obtained.

In the present embodiment, the silicon oxinitride film 16a is thicker at its ends than in its center in a direction perpendicular to the bit lines (direction parallel to the word lines). The film thickness of the silicon oxinitride film 16a is thus gradually increases from its center toward its ends. This reduces the opposite area between the floating gates 13 adjacent to each other in the word line direction and thus reduces the parasitic capacitance. The operating voltages for writing and erasing can thus be reduced. The decrease in parasitic capacitance also makes it possible to prevent malfunctioning caused by the interference between adjacent memory cells. The present embodiment therefore provides a reliable, high-performance nonvolatile memory with excellent characteristics by reducing the operating voltages and preventing malfunctioning.

The above embodiment enables the simplification of the manufacture process by forming, during one step, the silicon oxinitride film 16a on the top surface of the silicon nitride film 12 and the silicon oxinitride film 16b on the bottom surface of the silicon nitride film 12. The silicon oxinitride film 16b need not necessarily be formed. For example, when an extending structure is formed during the step shown in FIGS. 3A and 3B, the oxidizing (oxinitriding) process may be executed after only the polysilicon film 13 has been patterned. Even without the silicon oxinitride film 16b provided on the bottom surface of the silicon nitride film 12, the silicon oxinitride film 16a provided on the top surface of the silicon nitride film 12 enables both an increase in erasing operation speed and the provision of the charge retention characteristic. Further, the larger thickness of the silicon oxinitride film 16a at its ends enables a reduction in the parasitic capacitance between the adjacent floating gates 13. This makes it possible to reduce the operating voltages and prevent malfunctioning.

Embodiment 2

Now, description will be given of a semiconductor device (nonvolatile memory) in accordance with a second embodiment of the present invention. The basic structure of this semiconductor device and the basic method of manufacturing it are similar to those in the first embodiment. Accordingly, the matters described in the first embodiment will not be described below.

Figure 12:
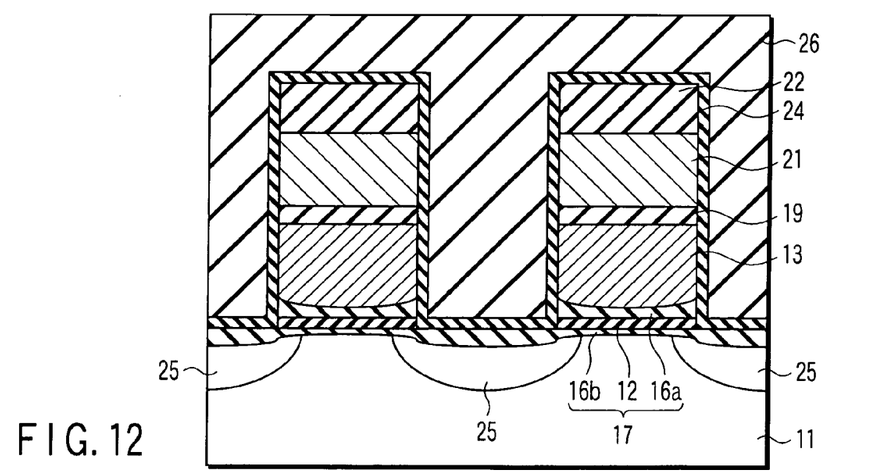
FIG. 12 is a sectional view schematically showing the configuration of a semiconductor device in accordance with the second embodiments of the present invention.

FIG. 12 is a sectional view schematically showing the configuration of the semiconductor device in the bit line direction. In this figure, the same components as those shown in the first embodiment are denoted by the same reference numerals, with their detailed description omitted.

In the first embodiment, the extending structure 15 extending in the bit line direction is first formed during the step shown in FIGS. 3A and 3B. Then, the oxidizing (oxinitriding)

process is executed during the step shown in FIGS. 4A and 4B to form a silicon oxide film containing nitrogen (silicon oxinitride film) 16a and a silicon oxide film containing nitrogen (silicon oxinitride film) 16b. In the present embodiment, a gate structure 23 is formed during a step shown in FIGS. 6A and 6B. Then, before the step shown in FIGS. 7A and 7B, an oxidizing process (oxinitriding process) similar to that in the first embodiment is executed to form a silicon oxide film containing nitrogen (silicon oxinitride film) 16a and a silicon oxide film containing nitrogen (silicon oxinitride film) 16b. That is, the present embodiment forms silicon oxinitride films 16a and 16b after the step shown in FIGS. 6A and 6B and not during the step shown in FIGS. 4A and 4B. The present embodiment will be described below in detail.

In the present embodiment, when the gate structure 23 is formed during the step of the first embodiment shown in FIGS. 6A and 6B, the exposed part of the silicon nitride film 12 is also removed. An oxidizing process is subsequently executed in a manner similar to that in the first embodiment. The oxidizing process causes the oxidizing agent to diffuse through the polysilicon film 13 to reach the interface between the silicon nitride film 12 and the polysilicon film 13. This causes the polysilicon film 13 near the interface to be oxidized and nitrided (oxinitrided) in accordance with a principle similar to that in the first embodiment. A silicon oxide film (silicon oxinitride film) 16a is thus formed which contains nitrogen and which constitutes a part of the tunnel insulating film 17. Similarly, the oxidizing agent diffuses through the silicon substrate 11 to reach the interface between the silicon nitride film 12 and the silicon substrate 11. This causes the silicon substrate 11 near the interface to be oxidized and nitrided (oxinitrided). A silicon oxide film (silicon oxinitride film) 16b is thus formed which contains nitrogen and which constitutes a part of the tunnel insulating film 17.

The above steps result in a tunnel insulating film 17 formed of the silicon nitride film 12 and the silicon oxinitride films 16a and 16b. The subsequent basic steps are similar to those in the first embodiment and a nonvolatile memory is obtained which has such a memory cell structure as shown in FIG. 12.

As described above, in the present embodiment, the tunnel insulating film 17 has the structure in which the high dielectric constant film (silicon nitride film 12) is sandwiched between the low dielectric constant films (silicon oxinitride films 16a and 16b) as in the case of the first embodiment. Therefore, like the first embodiment, the present embodiment can increase the writing and erasing operation speeds and provides the charge retention characteristic.

Further, like the first embodiment, the present embodiment forms silicon oxinitride films 16a and 16b by oxinitriding the polysilicon film 13 and the silicon substrate 11. Therefore, like the first embodiment, the present embodiment can provide a reliable, high-performance nonvolatile memory with excellent characteristics using the tunnel insulating film excellent in film quality and interface characteristics.

In the present embodiment, the silicon oxinitride films 16a and 16b are thicker at their ends than in their center in a direction perpendicular to the word lines (direction parallel to the bit lines). The film thickness of the silicon oxinitride films 16a and 16b is thus gradually increases from their center toward their ends. This reduces the parasitic capacitance between the floating gates 13 adjacent to each other in the bit line direction. Therefore, like the first embodiment, the present embodiment can reduce the operating voltages and prevent malfunctioning, thus providing a reliable, high-performance nonvolatile memory with excellent characteristics.

Figure 13:
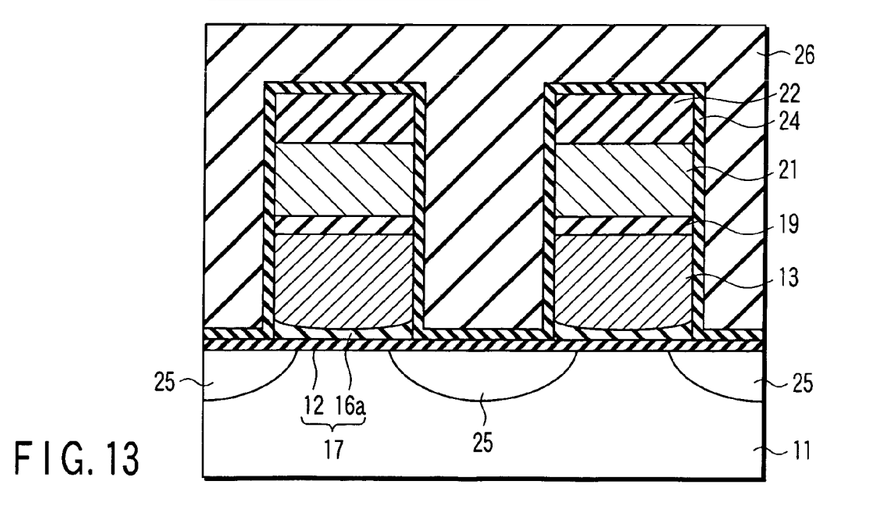
FIG. 13 is a sectional view schematically showing the configuration of a semiconductor device in accordance with a variation of the second embodiment of the present invention.

FIG. 13 is a sectional view in the bit line direction schematically showing the configuration of a variation of the semiconductor device in accordance with the present embodiment.

In the present variation, after the gate structure 23 is formed during the step shown in FIGS. 6A and 6B, an oxidizing (oxinitriding) process is executed before the step shown in FIGS. 7A and 7B as in the case of the example shown in FIG. 12. In the example shown in FIG. 12, the exposed part of the silicon nitride film 12 is removed when the gate structure 23 is formed during the step shown in FIGS. 6A and 6B. However, the present variation executes the oxinitriding process without removing the silicon nitride film 12. Before the oxinitriding process is executed, the surface of the silicon substrate 11 is covered with the silicon nitride film 12. The oxidizing agent is thus blocked by the silicon nitride film 12 and the silicon substrate 11 is not oxidized. As a result, the present variation does not form a silicon oxinitride film 16b but only forms a silicon oxinitride film 16a.

Even without the silicon oxinitride film 16b provided on the bottom surface of the silicon nitride film 12, the silicon oxinitride film 16a provided on the top surface of the silicon nitride film 12 enables both an increase in erasing operation speed and the provision of the charge retention characteristic. Further, the larger thickness of the silicon oxinitride film 16a at its ends enables a reduction in the parasitic capacitance between the adjacent floating gates 13. This makes it possible to reduce the operating voltages and prevent malfunctioning. The present variation can further form a shallow and high concentrated diffusion layer 25, thus advantageously preventing the degradation of transistor characteristics of the memory cell.

The first and second embodiments have been described but may be varied as described below.

The first embodiment executes an oxidizing process (oxinitriding process) after forming an extending structure 15 during the step shown in FIGS. 3A and 3B, to form a silicon oxide film containing nitrogen (silicon oxinitride film). The second embodiment executes an oxidizing process (oxinitriding process) after forming a gate structure 23 during the step shown in FIGS. 6A and 6B, to form a silicon oxide film containing nitrogen (silicon oxinitride film). However, both the oxidizing processes (oxinitriding processes) in the first and second embodiments may be executed. That is, the oxidizing process may be executed after the formation of an extending structure 15 during the step shown in FIGS. 3A and 3B and then after the formation of a gate structure 23 during the step shown in FIGS. 6A and 6B. In this case, a nonvolatile memory is obtained which has such a cross section as shown in FIG. 7B in the word line direction and such a cross section as shown in FIG. 12 in the bit line direction.

The first and second embodiments use a silicon substrate as the semiconductor substrate 11 but may use an SiC substrate, an SiGe substrate, or the like. That is, the semiconductor substrate 11 may be any semiconductor substrate containing silicon. Further, the first and second embodiments use a polysilicon film as the floating gate electrode film 13 but may use an SiC film, an SiGe film, or the like. That is, the floating gate electrode film 13 may be a semiconductor film containing silicon.

The first and second embodiments use a nitrogen monoxide (NO) gas as the oxidizing agent. However, in general, an oxidizing agent containing oxygen and nitrogen may be used. For example, an $N_2O$ gas, an $NO_2$ gas, an $NH_3/O_2$ mixed gas, or the like may be used instead of the NO gas. In general, an oxidizing agent containing oxygen may be used. For example, an oxygen gas may be used as the oxidizing agent.

In this case, oxide films 16a and 16b are formed as silicon oxide films. If an oxygen gas is used as the oxidizing agent, setting the substrate temperature at at most 800° C. enables the formation of silicon oxide films 16a and 16b of a sufficient thickness without making the oxide film 16 formed on the side surfaces of the extending structure 15 more thicker than required. Alternatively, during the oxidizing process, nitrogen monoxide may be initially used and an oxygen gas may be subsequently used, as the oxidizing agent. Also in this case, the silicon oxide films 16a and 16b of a sufficient thickness can be formed without making the oxide film 16 thicker than required.

The above first and second embodiments use the nitrogen radical generated by plasma to nitride the surface of the silicon substrate 11 to form a silicon nitride film 12. However, the nitrogen radical may be generated by another method. The silicon nitride film 12 may be formed by thermal nitriding using an ammonium ($NH_3$) gas. A nitrided film different from the silicon nitride film may be used as the nitride film (first insulating film) 12. For example, boron (B) nitride, aluminum (Al) nitride, gallium (Ga) nitride, or the like may be used as the nitride film 12. In any case, the oxidizing agent is unlikely to diffuse through the nitride and thus enables the silicon oxide films 16a and 16b to be formed without varying the film quality of the nitride film.

The first insulating film 12 may also be composed of a metal oxide film having a larger dielectric constant than the second insulating film 16a and third insulating film 16b. Examples of metal elements contained in the metal oxide film include aluminum (Al), hafnium (Hf), zirconium (Zr), and tantalum (Ta). If a metal oxide film is used as the first insulating film 12, the oxidizing agent such as nitrogen monoxide diffuses through the metal oxide film to cause what is called a bird's beak phenomenon, which allows the formation of oxide films 16a and 16b. Also in this case, a tunnel insulating film can be formed which has a shape similar to that of the tunnel insulating film 17 in accordance with the first and second embodiments. This makes it possible to produce effects similar to those described in the first and second embodiments. This method feeds the oxidizing agent into the metal oxide to effectively improve the film quality of the metal oxide.

Figure 14:
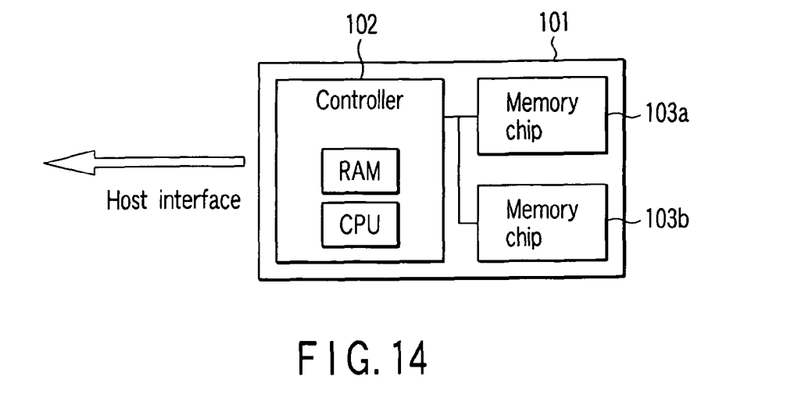
FIG. 14 is a diagram showing a memory card comprising a NAND type flash memory.
Figure 15:
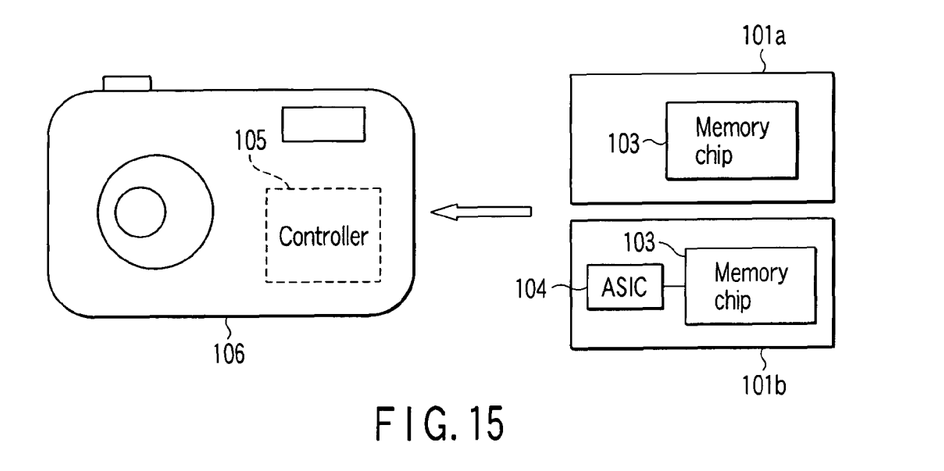
FIG. 15 is a diagram showing a memory card comprising a NAND type flash memory.
Figure 16:
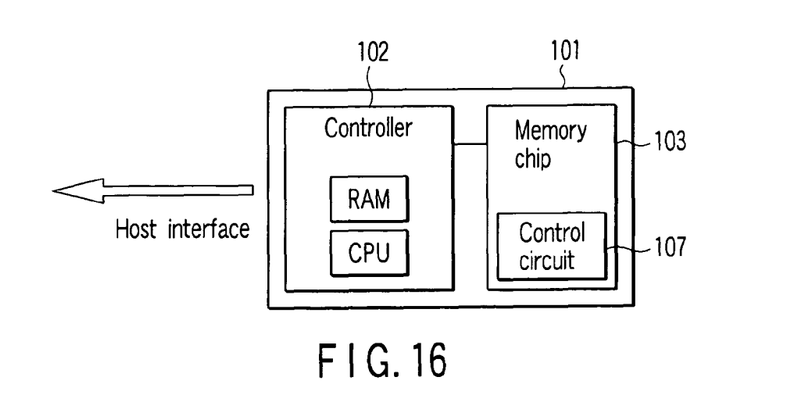
FIG. 16 is a diagram showing a memory card comprising a NAND type flash memory.

FIGS. 14, 15, and 16 show memory cards comprising the NAND type flash memory shown in the first and second embodiments.

FIG. 14 shows a memory card comprising a controller and a memory chip. The memory card 101 is equipped with a controller 102 and a plurality of memory chips 103a and 103b. The memory chips 103a and 103b each comprises the NAND type flash memory described above in the embodiments. The controller 102 comprises a RAM and a CPU. A host interface may be, for example, an ATA interface, a PC card interface, or a USB. Any other interface may be used. The controller 102 and the memory chips 103a and 103b may be incorporated into one chip or provided in the respective chips.

FIG. 15 shows a memory card comprising no controller. A memory card 101a is equipped only with the memory chip 103. A memory card 101b is equipped with the memory chip 103 and a relatively small-scale logic circuit (ASIC) 104. The memory chip 103 comprises the NAND type flash memory described above in the embodiments. A host apparatus to which the memory cards 101a and 101b are connected is, for example, a digital camera 106 having a controller 105.

FIG. 16 shows a memory chip having a control circuit. The memory card 101 is equipped with the controller 102 and the memory chip 103 having a control circuit 107.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate containing silicon and including a source region, a drain region, and a channel region between the source region and the drain region;
   a tunnel insulating film formed on the semiconductor substrate and including a first insulating film having a first dielectric constant and a second insulating film formed on the first insulating film and having a second dielectric constant smaller than the first dielectric constant;
   a floating gate electrode formed on the tunnel insulating film and formed of a semiconductor film containing silicon;
   an inter electrode insulating film formed on the floating gate electrode; and
   a control gate electrode formed on the inter electrode insulating film,
   an oxinitride film formed on a side surface of the floating gate electrode, the side surface extending to a channel length direction,
   wherein the second insulating film is formed of an oxide film and is thicker at its ends than in its center in a channel width direction,
   the inter electrode insulating film contacts the oxinitride film on the side surface of the floating gate electrode, and
   the oxinitride film has a distribution of a nitrogen concentration, across its thickness, in which the nitrogen concentration is higher near an interface between the oxinitride film and the floating gate electrode.

2. The device according to claim 1, wherein the tunnel insulating film further includes a third insulating film formed between the semiconductor substrate and the first insulating film and having a third dielectric constant smaller than the first dielectric constant, and
   the third insulating film is formed of an oxide film and is thicker at its ends than in its center in the channel width direction.

3. The device according to claim 1, wherein the second insulating film is thicker at its ends than in its center in a direction perpendicular to the channel width direction.

4. The device according to claim 1, wherein the second insulating film is formed of an oxide film containing nitrogen.

5. A method of manufacturing a semiconductor device, comprising:
   forming a first insulating film on a semiconductor substrate containing silicon, the first insulating film having a first dielectric constant and constituting a part of a tunnel insulating film;
   forming a floating gate electrode film on the first insulating film, the floating gate electrode film being formed of a semiconductor film containing silicon;
   patterning the floating gate electrode film, the first insulating film, and the semiconductor substrate to form a first structure having a first side surface;
   exposing the first structure to an atmosphere containing an oxidizing agent;
   oxidizing that part of the floating gate electrode film which corresponds to a boundary between the first insulating film and the floating gate electrode film using the oxidizing agent, to form a second insulating film having a second dielectric constant smaller than the first dielectric constant and constituting a part of the tunnel insulating film;

forming an inter electrode insulating film on the first structure;

forming a control gate electrode film on the inter electrode insulating film; and patterning the control gate electrode film, the inter electrode insulating film, and the floating gate electrode film to form a second structure having a second side surface perpendicular to the first side surface, wherein forming the second insulating film includes oxinitriding the first side surface of the first structure to form an oxinitride film, the inter electrode insulating film contacts the oxinitride film on the first side surface, and the oxinitride film has a distribution of a nitrogen concentration, across its thickness, in which the nitrogen concentration is higher near an interface between the oxinitride film and the floating gate electrode film.

6. The method according to claim 5, wherein forming the second insulating film includes oxidizing that part of the semiconductor substrate which corresponds to a boundary between the first insulating film and the semiconductor substrate using the oxidizing agent, to form a third insulating film having a third dielectric constant smaller than the first dielectric constant and constituting a part of the tunnel insulating film.

7. The method according to claim 5, wherein the oxidizing agent contains oxygen and nitrogen, and
the second insulating film is formed of an oxide film containing nitrogen.

8. The method according to claim 5, wherein the first insulating film is formed of a nitride film obtained by nitriding a surface of the semiconductor substrate.

9. The method according to claim 5, wherein the first insulating film is formed of a silicon nitride film.

10. The method according to claim 5, wherein the first insulating film is formed of a metal oxide film.

11. The method according to claim 5, wherein the second insulating film is formed of a silicon oxide film containing nitrogen.

12. The method according to claim 5, wherein the second insulating film is thicker at its ends than in its center in a direction perpendicular to the first side surface.

13. The device according to claim 1, further comprising an isolation insulating film apart from the floating gate electrode by the oxinitride film interposed therebetween.

14. The device according to claim 1, wherein the oxinitride film contacts the second insulating film.

15. The method according to claim 5, further comprising forming an isolation insulating film apart from the floating gate electrode film by the oxinitride film interposed therebetween.

16. The method according to claim 5, wherein the oxinitride film contacts the second insulating film.

* * * * *